(12) United States Patent
Choi et al.

(10) Patent No.: US 9,190,571 B2
(45) Date of Patent: Nov. 17, 2015

(54) LIGHT EMITTING DEVICE

(71) Applicant: LG INNOTEK CO., LTD., Seoul (KR)

(72) Inventors: Eun Sil Choi, Seoul (KR); Jeong Tak Oh, Seoul (KR); Myung Hoon Jung, Seoul (KR); Ki Young Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/057,193

(22) Filed: Oct. 18, 2013

(65) Prior Publication Data
US 2014/0110720 A1   Apr. 24, 2014

(30) Foreign Application Priority Data

Oct. 19, 2012   (KR) .......................... 10-2012-0116371

(51) Int. Cl.
*H01L 33/32* (2010.01)
*H01L 33/06* (2010.01)

(52) U.S. Cl.
CPC .............. *H01L 33/325* (2013.01); *H01L 33/06* (2013.01); *H01L 33/32* (2013.01); *H01L 2224/48091* (2013.01); *H01L 2224/48247* (2013.01)

(58) Field of Classification Search
CPC ......... H01L 33/26; H01L 33/32; H01L 29/08; H01L 33/06; H01L 31/109
USPC ................. 257/57, 59, 66, 72, 359, 390, 443, 257/E21.411, E21.412, E51.005, E29.151, 257/E27.1, E29.117; 438/30, 149, 158–159
See application file for complete search history.

(56) References Cited

U.S. PATENT DOCUMENTS

| | | | |
|---|---|---|---|
| 7,342,753 B2 * | 3/2008 | Gill | 360/324.12 |
| 2006/0118820 A1 * | 6/2006 | Gaska et al. | 257/189 |
| 2007/0297102 A1 * | 12/2007 | Gill | 360/324.11 |
| 2012/0007113 A1 | 1/2012 | Hwang et al. | 257/94 |
| 2012/0008657 A1 | 1/2012 | Obata et al. | 372/45.01 |
| 2012/0145993 A1 * | 6/2012 | Na et al. | 257/13 |
| 2012/0161102 A1 | 6/2012 | Won | 257/13 |

FOREIGN PATENT DOCUMENTS

| | | |
|---|---|---|
| EP | 0 886 326 A2 | 12/1998 |
| EP | 2 562 827 A2 | 2/2013 |

(Continued)

OTHER PUBLICATIONS

Han, Sang-Heon et al.: "Effect of Electron Blocking Layer on Efficiency Droop in InGaN/GaN Multiple Quantum Well Light-Emitting Diodes"; Applied Physics Letters, American Institute of Physics; vol. 94, No. 23; Jun. 12, 2009; pp. 231123-1-231123-3 (XP-012121574).

(Continued)

*Primary Examiner* — Fernando L Toledo
*Assistant Examiner* — Lawrence-Linh T Nguyen
(74) *Attorney, Agent, or Firm* — KED & Associates LLP

(57) ABSTRACT

A light emitting device includes a first semiconductor layer having a first conductive dopant, an active layer on the first semiconductor layer, an electron blocking layer on the active layer, a carrier injection layer between the active layer and the electron blocking layer, and a second semiconductor layer having a second conductive dopant on the electron blocking layer. The carrier injection layer includes the first conductive dopant and the second conductive dopant, and the first conductive dopant of the carrier injection layer has a concentration lower than a concentration of the second conductive dopant.

18 Claims, 4 Drawing Sheets

(56) References Cited

FOREIGN PATENT DOCUMENTS

| JP | 11-251687 A | 9/1999 |
| JP | 2012-018963 A | 1/2012 |
| JP | 2012-019068 A | 1/2012 |

OTHER PUBLICATIONS

Wang, C. et al.: "Hole Injection and Efficiency Droop Improvement in InGaN/GaN Light-Emitting Diodes by Band-Engineered Electron Blocking Layer"; Applied Physics Letters, American Institute of Physics; vol. 97, No. 26; Dec. 28, 2010; pp. 261103-261103-3 (XP-012138275).

Wu Le Juan et al.: "Simulation Study of Blue InGaN Multiple Quantum Well Light-Emitting Diodes with Different Hole Injection Layers"; Interdisciplinary Physics and Related Areas of Science and Technology; Chinese Physics B; Bristol, Great Britain; vol. 21, No. 6; Jun. 14, 2012; p. 68506-68506-5(XP-020224606).

European Search Report dated Feb. 11, 2014 issued in Application No. 13 18 7924.9.

Japanese Office Action dated Aug. 5, 2014, issued in Application No. 2013-217270.

* cited by examiner

LIGHT EMITTING DEVICE

CROSS-REFERENCE TO RELATED APPLICATIONS

The present application claims priority under 35 U.S.C. §119(a) of Korean Patent Application No. 10-2012-0116371 filed on Oct. 19, 2012, which is hereby incorporated by reference in its entirety.

BACKGROUND

1. Field

The embodiment relates to a light emitting device.

2. Background

In comparison with other light sources such as a fluorescent lamp and an incandescent lamp, the semiconductor light emitting device is advantageous because of low power consumption, a long lifetime, a fast response time, safety, and environment-friendliness. Accordingly, many studies and researches to substitute the existing light sources with the semiconductor light emitting device have been carried out.

In addition, semiconductor light emitting devices have a tendency increasingly used as light sources of a variety of lamps used in indoor and outdoor places, liquid crystal displays, electronic displays, or lighting devices such as streetlamps.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

In the description of embodiments, it will be understood that when one component is referred to as being 'on (above)' or 'under (below)' another component, the terminology of 'on (above)' and 'under (below)' includes both the meanings of 'directly' and 'indirectly'. Further, the meaning of 'on' and 'under' each layer may include not only an upper direction, but also a lower direction.

Figure 1:
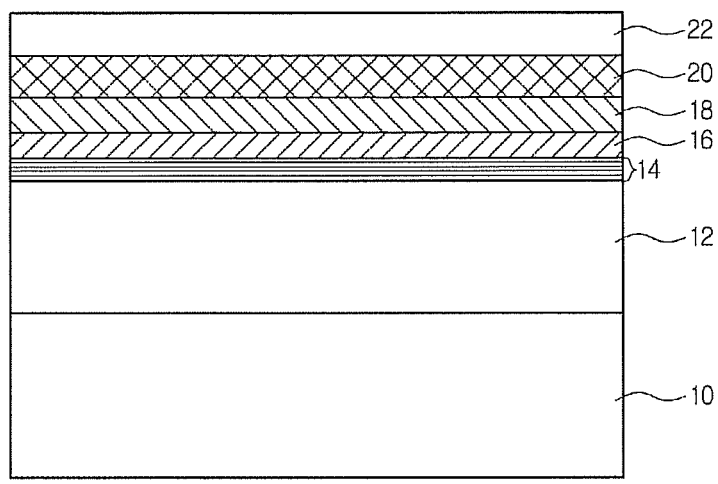
FIG. 1 is a sectional view showing a light emitting device according to a first embodiment.

FIG. 1 is a sectional view showing a light emitting device according to the first embodiment.

Referring to FIG. 1, a light emitting device 1 according to the to the first embodiment may include a substrate 10, a first conductive semiconductor layer 12, an active layer 14, a spacer layer 16, a carrier injection layer 18, an electron blocking layer 20, and a second conductive semiconductor layer 22, but the embodiment is not limited thereto.

A light emitting structure may be formed by the first conductive semiconductor layer 12, the active layer 14, the spacer layer 16, the carrier injection layer 18, the electron blocking layer 20, and the second conductive semiconductor layer 22.

The light emitting device 1 according to the embodiment may further include a buffer layer (not shown) disposed between the substrate 10 and the first conductive semiconductor layer 12.

The light emitting device 1 according to the embodiment may further include another semiconductor layer (not shown) provided under the first conductive semiconductor layer 12 and/or on the second conductive semiconductor layer 22.

The light emitting device 1 according to the embodiment may further include an undoped semiconductor layer (not shown) disposed between the buffer layer and the first conductive semiconductor layer 12.

The substrate 10 grows the light emitting structure, but the embodiment is not limited thereto.

In order to stably grow the light emitting structure, the substrate 10 may include a material representing a smaller difference from the light emitting structure in terms of a lattice constant.

The substrate 10 may include at least one selected from the group consisting of sapphire ($Al_2O_3$), SiC, Si, GaAs, GaN, ZnO, Si, GaP, InP, and Ge.

A buffer layer 22 may be disposed between the substrate 3 and the light emitting structure 20. The buffer layer 22 may be formed to reduce the lattice constant difference between the substrate 10 and the light emitting structure.

The buffer layer 22, the undoped semiconductor layer, the first conductive semiconductor layer 12, the active layer 14, the spacer 16, the carrier injection layer 18, the electron blocking layer 20, and the second conductive semiconductor layer 22 may include group II to VI compound semiconductor materials.

The first conductive semiconductor layer 12 may be formed on the substrate 10.

For example, the first conductive semiconductor layer 12 may include an N type semiconductor layer including N type dopants. The first conductive semiconductor layer 12 may include a semiconductor material having a composition formula of $In_xAl_yGa_{1-x-y}N (0 \leq x \leq 1, 0 \leq y \leq 1, 0 \leq x+y \leq 1)$. For instance, the first conductive semiconductor layer 12 may include at least one selected from the group consisting of InAlGaN, GaN, AlGaN, InGaN, AlN, InN and AlInN, and may be doped with N type dopants such as Si, Ge, and Sn.

The active layer 14 may be formed on the first conductive semiconductor layer 12.

The active layer 14 may generate light having a wavelength corresponding to the energy bandgap difference varied depending on a material constituting the active layer 14 through the recombination of first carriers (e.g., electrons), which are injected from the first conductive semiconductor layer 12, and second carriers (e.g., holes) injected through the second conductive semiconductor layer 22.

The active layer 14 may include one of a multi quantum well (MQW) structure, a quantum dot structure, or a quantum wire structure. The active layer 14 may be formed by repeatedly laminating group II to VI compound semiconductors at a cycle of a well layer and a barrier layer.

For example, the active layer 14 may be formed at a cycle of InGaN well layer/GaN barrier layer, a cycle of InGaN well layer/AlGaN barrier layer, or a cycle of InGaN well layer/

InGaN barrier layer. The bandgap of the barrier layer may be greater than the bandgap of the well layer.

The space layer 16 may be formed on the active layer 14.

The spacer layer 16 may include at least one of InGaN, AlGaN, and AlInGaN. The spacer layer 16 may have a bulk structure, which is a single layer structure, or a superlattice structure which is a multi-layer structure, but the embodiment is not limited thereto. A content of indium (In) of the spacer layer 16 may be in the range of 0.01% to 5%, but the embodiment is not limited thereto. A content of Al of the spacer layer 16 may be in the range of 0.01% to 10%, but the embodiment is not limited thereto.

The spacer layer 16 may minimize the energy bend bending exerted between the active layer 14 and the electron blocking layer 20. The spacer layer 16 may not include dopants, but the embodiment is not limited thereto.

The carrier injection layer 18 may be formed on the spacer layer 16. The carrier injection layer 18 may increase the generation of carriers, for example, the generation of holes. Meanwhile, the carrier injection layer 18 may easily inject the holes into the active layer 14. The carrier injection layer 18 may include P type dopants such as Mg, Zn, Ca, Sr, and Ba, but the embodiment is not limited thereto. In addition, the carrier injection layer 18 may include N type dopants such as Si, Ge, or Sn, but the embodiment is not limited thereto.

The concentration of P type dopants may be at least greater than the concentration of N type dopants at the carrier injection layer 18, so that the carrier injection layer 18 has a P type characteristic. For example, although the concentration of the P type dopants may be in the range of 1E19 to 5E20, but the embodiment is not limited thereto. For example, the concentration of N type dopants may be in the range of 1E16 to 1E20, but the embodiment is not limited thereto.

The carrier injection layer 18 may include a semiconductor material having a composition formula of $In_xAl_yGa_{1-x-y}N$ ($0 \leq x \leq 1$, $0 \leq y \leq 1$, and $0 \leq x+y \leq 1$). For example, the carrier injection layer 18 may include at least one selected from the group consisting of InAlGaN, GaN, AlGaN, InGaN, AlN, InN and AlInN.

Figure 4:
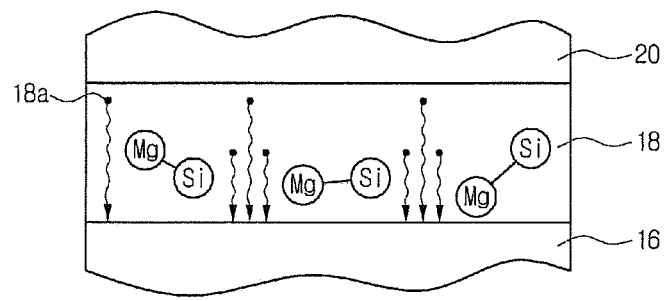
FIG. 4 is a view showing carrier injection in a carrier injection layer of the light emitting device of FIG. 1.

As shown in FIG. 4, the carrier injection layer 18 may include the atoms of magnesium (Mg) serving as P type dopants and the atoms of silicon (Si) serving as N type dopants. In this case, the atoms of the silicon (Si) may be bonded with the atoms of the magnesium (Mg) due to the structure, thereby preventing the injection of the holes 18a of the carrier injection layer 18 from being interrupted due to the atoms of the magnesium (Mg).

If the atoms of the silicon (Si) are not provided, the holes 18a of the carrier injection layer 18 may be blocked by the atoms of the magnesium (Mg), so that the holes 18a of the carrier injection layer 18 may not be injected. The atoms of the silicon (Si) confine the atoms of the magnesium (Mg), thereby allowing the holes 18a to pass through the carrier injection layer 18.

The atoms of the magnesium (Mg) and the atoms of the silicon (Si) may be doped on the carrier injection layer 18 through a co-doping scheme, but the embodiment is not limited thereto.

The electron blocking layer 20 may be formed on the carrier injection layer 18. The electron blocking layer 20 may prevent electrons, which are generated from the first conductive semiconductor layer 12 and supplied to the active layer 14 from being deviating from the active layer 14 to move the conductive semiconductor layer 22.

Figure 2:
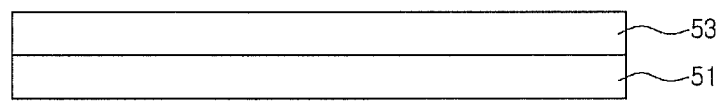
FIG. 2 is a sectional view showing an electron blocking layer in the light emitting device of FIG. 1.

As shown in FIG. 2, the electron blocking layer 20 may include at least two layer including a first electron blocking layer 51 and a second electron blocking layer 53, but the embodiment is not limited thereto. In this case, the first electron blocking layer 51 may be a p-InAlGaN layer, and the second electron blocking layer 53 may be a p-AlGaN layer. In this case, the energy bandgap of the second electron blocking layer 53 may be at least greater than then energy bandgap of the first electron blocking layer 51 (See FIG. 3). As described above, as the energy bandgap of the second electron blocking layer 53 is gradually greater than the energy bandgap of the first electron blocking layer 51 from the active layer 14 to the second conductive semiconductor layer 22, thereby primarily blocking the electrons deviating from the active layer 14 by the first electron blocking layer 51. A portion of electrons passing through the first electron blocking layer 51 may be secondarily blocked by the second electron blocking layer 53 having the energy bandgap greater than that of the first electron blocking layer 51. Accordingly, the electron blocking layer 20 has a plurality of layers having energy bandgaps different from each other, thereby minimizing the movement of the electrons deviating from the active layer 14 to the second conductive semiconductor layer 22.

The second conductive semiconductor layer 22 may be formed on the electron blocking layer 20. For example, the second conductive semiconductor layer 22 may include a P type semiconductor layer including P type dopants. The second conductive semiconductor layer 22 may include a semiconductor material having a composition formula of $In_xAl_yGa_{1-x-y}N$ ($0 \leq x \leq 1$, $0 \leq y \leq 1$, and $0 \leq x+y \leq 1$). For example, the second conductive semiconductor layer 22 may include at least one selected from the group consisting of InAlGaN, GaN, AlGaN, InGaN, AlN, InN and AlInN, and may be doped with P type dopants such as Mg, Zn, Ca, Sr, and Ba.

The second conductive semiconductor layer 22 may generate holes and supply the holes to the active layer 14 through the electron blocking layer 20.

In this case, the carrier injection layer 18 may allow the holes generated from the second conductive semiconductor layer 22 to be injected into the active layer 14. In addition, the carrier injection layer 18 generates the holes so that the holes may be injected into the active layer 14.

Meanwhile, the holes generated from the second conductive semiconductor layer 22 may not be supplied to the active layer 14 by the electron blocking layer 20.

Since the carrier injection layer 18 may generate holes, the holes generated from the carrier injection layer 18 may be supplied to the active layer 14.

Therefore, the carrier injection layer 18 may compensate that the holes generated from the second conductive semiconductor layer 22 are not supplied to the active layer 14. Accordingly, the light emission efficiency of the light emitting device can be improved.

In addition, the carrier injection layer 18 confines the atoms of Mg serving as P type dopants by the atoms of Si serving as N type dopants, so that the holes generated from the second conductive semiconductor layer 22 or the holes generated from the carrier injection layer 18 are easily injected to the active layer 14. Accordingly, the light emission efficiency of the light emitting device can be improved.

Figure 3:
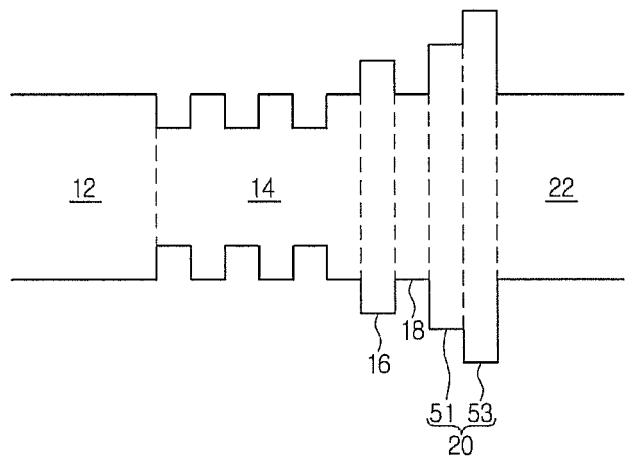
FIG. 3 is a view showing an energy band diagram showing the light emitting device of FIG. 3.

Meanwhile, as shown in FIG. 3, the first conductive semiconductor layer 12, the active layer 14, the spacer layer 16, the carrier injection layer 18, the electron blocking layer 20, and the second conductive semiconductor layer 22 may have energy bandgaps different from each other.

For example, the first conductive semiconductor layer 12, the spacer layer 16, the carrier injection layer 18, and the second conductive semiconductor layer 22 may have the energy bandgaps equal to or greater than the energy bandgap of the barrier layer of the active layer 14, or may have the energy bandgap greater than the bandgap of the well layer of the active layer 14.

For example, the first conductive semiconductor layer 12, the spacer layer 16, the carrier injection layer 18, and the second conductive semiconductor layer 22 may include a GaN-based semiconductor, but the embodiment is not limited thereto.

The electrons generated from the first conductive semiconductor layer 12 and the holes generated from the second conductive semiconductor layer 22 are supplied to the active layer 14, so that light may be generated from the active layer 14.

The spacer layer 16 may have the energy bandgap equal to or greater than the energy bandgap of the barrier layer of the active layer 14. For example, the spacer layer 16 may include AlInGaN or AlGaN, but the embodiment is not limited thereto.

Therefore, the spacer layer 16 may minimize the energy bend bending exerted between the active layer 14 and the electron blocking layer 20. The electron blocking layer 20 may have an energy bandgap at least greater than the spacer layer 16 or the carrier injection layer 18. For example, the electron blocking layer 20 may include AlInGaN or AlGaN, but the embodiment is not limited thereto. Accordingly, the electron blocking layer 20 may prevent the electrons deviating from the active layer.

Figure 5:
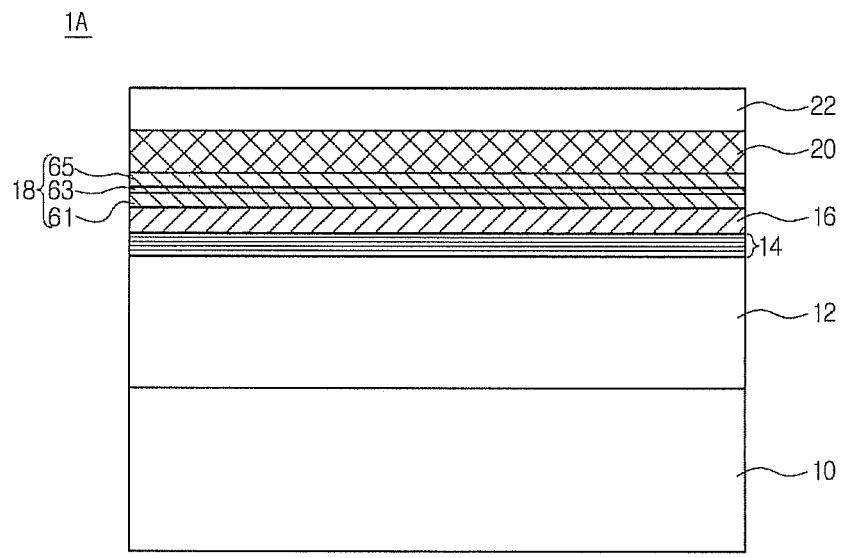
FIG. 5 is a section view showing a light emitting device according to the second embodiment.

FIG. 5 is a sectional view showing a light emitting device according to the second embodiment.

The second embodiment may be substantially similar to the first embodiment except for the carrier injection layer 18. Accordingly, in the second embodiment, components having the same structures or the same functions as those of the first embodiment are assigned with the same reference numerals, and the details thereof will be omitted. Hereinafter, those skilled in the art will easily understand the omitted description from the description of the first embodiment.

Referring to FIG. 5, a light emitting device 1A according to the second embodiment may include the substrate 10, the first conductive semiconductor layer, the active layer 14, the spacer layer 16, the carrier injection layer 18, the electron blocking layer 20, and the second conductive semiconductor layer 22, but the embodiment is not limited thereto.

Different from the first embodiment, the carrier injection layer 18 according to the second embodiment includes a first p-GaN layer 61, an undoped GaN layer 63, and the second p-GaN layer 65, but the embodiment is not limited thereto.

Each of the first and second p-GaN layers 61 and 65 may have a thickness corresponding to 5% to 50% based on the thickness of the second conductive semiconductor layer 22, but the embodiment is not limited thereto.

The undoped GaN layer 63 may have a thickness corresponding to 5% to 30% based on the thickness of each of the first and second p-GaN layers 61 and 65, but the embodiment is not limited thereto.

In this case, the first and second p-GaN layers 61 and 65 may include P type dopants such as Mg, Zn, Ca, Sr, and Ba. For example, the concentration of the P type dopants may be in the range of 1E19 to 5E20, but the embodiment is not limited thereto. For example, the undoped GaN layer 65 may not be doped with any type of dopants, but the embodiment is not limited thereto.

The first and second GaN layers 61 and 65 may generate second carriers, that is, holes.

The undoped GaN layer 63 may prevent semiconductor layers such as the second p-GaN layer 65, the electron blocking layer 20, and the second conductive semiconductor layer 22, which are grown in the subsequent process, from being defected, thereby improving the layer quality of the semiconductor layers.

Figure 7:
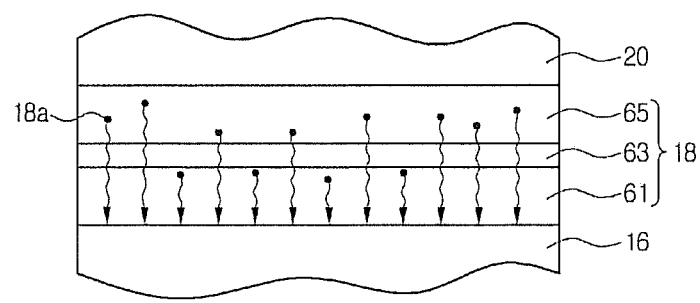
FIG. 7 is a view showing carrier injection in a carrier injection layer of the light emitting device of FIG. 5.

Thereafter, as shown in FIG. 7, the undoped GaN layer 63 may have a superlattice structure including a plurality of layers to generate a tunneling effect. The undoped GaN layer 63 may easily supply holes 18a, which are generated from the second p-GaN layer 65, to the first p-GaN layer 61.

Meanwhile, holes 18a generated from the second conductive semiconductor layer 22 may not be easily supplied to the active layer 14 by the electron blocking layer 20.

Since both of the first and second semiconductor layers 61 and 65 may generate holes 18a, the holes 18a generated from the first and second p-GaN layers 61 and 65 may be supplied to the active layer 14. Accordingly, the first and second p-GaN layers 61 and 65 may compensate that the holes 18a generated from the second conductive semiconductor layer 22 are not supplied to the active layer 14, thereby improving the light emission efficiency of the light emitting device.

Figure 6:
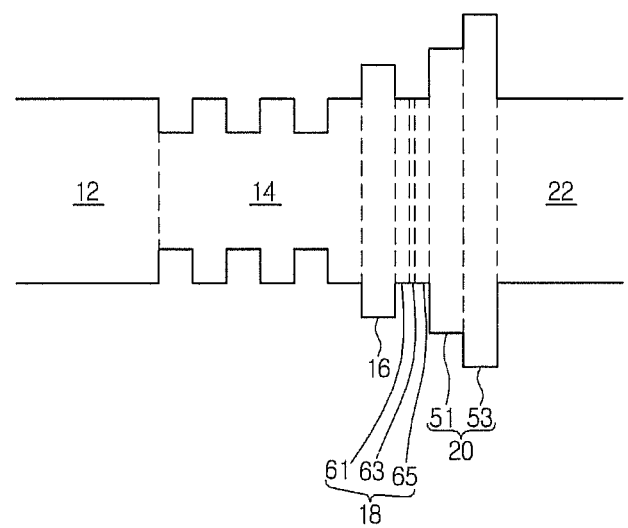
FIG. 6 is a view showing an energy band diagram showing a light emitting device of FIG. 5.

As shown in FIG. 6, the first conductive semiconductor layer 12, the active layer 14, the spacer layer 16, the carrier injection layer 18, the electron blocking layer 20, and the second conductive semiconductor layer 22 may have energy bandgaps different from each other.

All of the first p-GaN layer 61, the undoped GaN layer 63, and the second p-GaN layer 65 may have the same energy bandgap.

The first p-GaN layer 61, the undoped semiconductor layer 63, and the second p-GaN layer 65 may have energy bandgaps the same as or different from those of the first conductive semiconductor layer 12, the spacer layer 16, and second conductive semiconductor layer 22, but the embodiment is not limited thereto.

For example, the first p-GaN layer 61, the undoped GaN layer 63, and the second p-GaN layer 65 may include a GaN semiconductor, but the embodiment is not limited thereto.

Therefore, electrons generated from the first conductive semiconductor layer 12 and holes generated from the second conductive semiconductor layer 22 are supplied to the active layer 14, so that light can be generated in the active layer 14.

Meanwhile, the light emitting device according to the first and second embodiments may be manufactured in the form of a lateral-type light emitting device, a flip-type light emitting device, and a vertical-type light emitting device.

When the light emitting devices according to the first and second embodiments are manufactured in the form of the lateral-type light emitting device, a transparent conductive layer may be formed on the second conductive semiconductor layer 22, a first electrode may be formed on the first conductive semiconductor layer 12, and a second electrode may be formed on the transparent conductive layer.

The transparent conductive layer may include a conductive material representing superior transparency to transmit light and superior electrical conductivity. For example, the transparent conductive layer may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO.

In this case, the light generated from the active layer 14 may be easily output to the outside through the transparent conductive layer instead of the substrate.

When the light emitting devices according to the first and second embodiments are manufactured in the form of a flip-type light emitting device, a reflective layer may be formed on the second conductive semiconductor layer 22, a first electrode may be formed on the first conductive semiconductor layer 12, and a second electrode may be formed on the reflective layer. In this case, the light generated from the active layer 14 may be reflected by the reflective layer and output to the outside through the substrate.

When the light emitting devices according to the first and second embodiments are manufactured in the form of a vertical-type light emitting device, the substrate may be removed, a reflective layer and a support substrate serving as an electrode may be formed on the second conductive semiconductor layer 22, and an electrode may be formed on the first conductive semiconductor layer 12. In this case, since current flows between the reflective layer and the electrode, the vertical-type light emitting device may represent more improved light emission efficiency when comparing with the lateral-type light emitting device. In addition, the light generated from the active layer 14 may be reflected by the reflective layer and output to the outside through the first conductive semiconductor layer 12.

The first and second electrodes in the vertical-type light emitting device and the flip-type light emitting device and the electrode in the vertical-type light emitting device may include the same electrode material or materials different from each other.

The first and second electrodes in the vertical-type light emitting device and the flip-type light emitting device and the electrode in the vertical-type light emitting device may include an opaque metallic material. For example, the first and second electrodes in the vertical-type light emitting device and the flip-type light emitting device and the electrode in the vertical-type light emitting device may include one selected from the group consisting of aluminum (Al), titanium (Ti), chrome (Cr), nickel (Ni), platinum (Pt), gold (Au), tungsten (W), copper (Cu), and molybdenum (Mo), or the alloy thereof, but the embodiment is not limited thereto.

The reflective layers in the flip-type light emitting device and the vertical-type light emitting device may include at least one selected from the group consisting of Ag, Ni, Al, Rh, Pd, Ir, Ru, Mg, Zn, Pt, Au and Hf or the alloy of at least two of the above materials, but the embodiment is not limited thereto.

According to the embodiment, a carrier injection layer including P type dopants and N type dopants is disposed between an active layer and an electron blocking layer, so that the N type dopants confine the P type dopants to allow holes to be easily injected into the active layer, thereby improving light emission efficiency.

According to the embodiment, a carrier injection layer is disposed between the active layer and the electron blocking layer to generate holes. Accordingly, holes can be generated from not only the second conductive semiconductor layer, but also the carrier injection layer, so that the concentration of holes is totally increased, thereby improving the light emission efficiency.

According to the embodiment, a carrier injection layer including at least one semiconductor layer to generate holes and an undoped semiconductor layer to improve the layer quality is disposed between an active layer and an electron blocking layer, thereby not only generating more many holes, but also improving the layer quality of the semiconductor layer, such as the second conductive semiconductor layer, grown after the carrier injection layer. Accordingly, the light emission efficiency can be improved.

Figure 8:
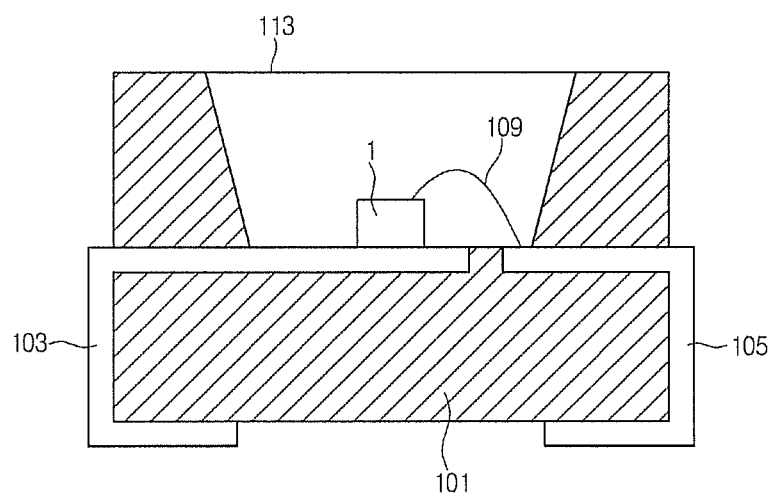
FIG. 8 is a sectional view showing a light emitting device package according to the embodiment.

FIG. 8 is a sectional view showing a light emitting device package according to the embodiment.

Referring to FIG. 8, the light emitting device package according to the embodiment includes a body 101, first and second lead electrodes 103 and 105 installed in the body 101, a light emitting device 1 according to the first embodiment or the second embodiment to receive power from the first and second lead electrodes 103 and 105, and a molding member 113 to surround the light emitting device 1.

The body 101 may include a silicon material, a synthetic resin material, or a metallic material, and inclined surfaces may be formed around the light emitting device 1.

The first and second lead electrodes 103 and 105 are electrically insulated from each other to supply power to the light emitting device 1.

In addition, the first and second lead electrodes 103 and 105 may reflect light generated from the light emitting device 1 to improve the light efficiency, and discharge the heat generated from the light emitting device 1 to the outside.

The light emitting device 1 may be installed in one of the first lead electrode 103, the second lead electrode 105, and the body 101, and may be electrically connected to the first and second lead electrodes 103 and 105 through a wire scheme or a die bonding scheme, but the embodiment is not limited thereto.

According to the embodiment, although the light emitting device 1 is electrically connected to one of the first and second lead electrodes 103 and 105 through one wire 109 for the illustrative purpose, the embodiment is not limited thereto. In other words, the light emitting device 1 may be electrically connected to the first and second lead electrodes 103 and 105 by using two wires. Alternatively, the light emitting device may be electrically connected to the first and second lead electrodes 103 and 105 without a wire.

The molding member 113 may surround the light emitting device 1 to protect the light emitting device 1. In addition, the molding member 113 may include phosphors to convert the wavelength light emitted from the light emitting device 1.

A light emitting device package 200 according to the embodiment may include a chip on board (COB) type, the top surface of the body 101 may be flat, and a plurality of light emitting devices may be installed in the body 101.

The light emitting device or the light emitting device package according to the embodiment is applicable to the light unit. The light unit is applicable to a display device or a lighting device such as a unit including a lighting lamp, a signal lamp, a headlight of a vehicle, or an electronic signboard.

An embodiment provides a light emitting device capable of improving the light emission efficiency by increasing injected holes.

An embodiment provides a light emitting device capable of improving light emission efficiency by increasing the concentration of holes.

According to an embodiment, there is provided a light emitting device including a first semiconductor layer including a first conductive dopant, an active layer disposed on the first semiconductor layer, an electron blocking layer disposed on the active layer, a carrier injection layer disposed between the active layer and the electron blocking layer, and a second semiconductor layer including a second conductive dopant and disposed on the electron blocking layer. The carrier injection layer includes the first conductive dopant and the second conductive dopant, and the first conductive dopant of the carrier injection layer has a concentration lower than a concentration of the second conductive dopant.

According to an embodiment, there is provided a light emitting device including a first semiconductor layer comprising a first conductive dopant, an active layer on the first semiconductor layer, an electron blocking layer on the active layer, a carrier injection layer between the active layer and the electron blocking layer, and a second semiconductor layer comprising a second conductive dopant and disposed on the electron blocking layer. The carrier injection layer includes a third semiconductor layer comprising the second conductive dopant, a fourth semiconductor layer, which is undoped, disposed on the third semiconductor layer, and a fifth semiconductor layer, which comprises the second conductive dopant, on the fourth semiconductor layer.

According to an embodiment, a light emitting device package includes a body, first and second lead electrodes provided on the body, a light emitting device on one of the first and second electrodes, and a molding member to surround the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a first semiconductor layer having an n-type dopant;
    an active layer on the first semiconductor layer;
    an electron blocking layer on the active layer;
    a carrier injection layer between the active layer and the electron blocking layer; and
    a second semiconductor layer having a p-type dopant and provided on the electron blocking layer,
    wherein the carrier injection layer includes the n-type dopant and the p-type dopant,
    a concentration of the n-type dopant of the carrier injection layer is less than a concentration of the p-type dopant of the carrier injection layer, and
    the carrier injection layer comprises a bonded compound including an atom of the p-type dopant and an atom of the n-type dopant.

2. The light emitting device of claim 1, wherein the P type dopant of the carrier injection layer has a concentration in a range of 1E19 to 5E20.

3. The light emitting device of claim 1, wherein the N type dopant of the carrier injection layer has a concentration in a range of 1E16 to 1E20.

4. The light emitting device of claim 1, wherein the N type dopant comprises at least one selected from the group consisting of Si, Ge, and Sn.

5. The light emitting device of claim 1, the P type dopant comprises at least one selected from the group consisting of Mg, Zn, Ca, Sr and Ba.

6. The light emitting device of claim 1, further comprising a spacer layer between the active layer and the carrier injection layer.

7. The light emitting device of claim 6, wherein the spacer layer comprises at least one selected from the group consisting of InGaN, AlGaN and InAlGaN.

8. The light emitting device of claim 7, wherein the spacer layer comprises InGaN or InAlGaN, and a content of indium (In) is in a range of 0.01% to 5%.

9. The light emitting device of claim 7, wherein the spacer layer comprises AlGaN or InAlGaN, and a content of aluminum (Al) is in a range of 0.01% to 10%.

10. The light emitting device of claim 1, wherein the electron blocking layer comprises:
    a first electron blocking layer on the carrier injection layer; and
    a second electron blocking layer having a band gap greater than a band gap of the first electron blocking layer on the first electron blocking layer.

11. The light emitting device of claim 10, wherein the first electron layer comprises InAlGaN, and the second electron blocking layer comprises AlGaN.

12. A light emitting device comprising:
    a first semiconductor layer having a first conductive dopant;
    an active layer on the first semiconductor layer;
    an electron blocking layer on the active layer;
    a carrier injection layer between the active layer and the electron blocking layer; and
    a second semiconductor layer having a second conductive dopant and disposed on the electron blocking layer,
    wherein the carrier injection layer includes:
    a third semiconductor layer having the second conductive dopant;
    a fourth semiconductor layer, which is undoped, on the third semiconductor layer; and
    a fifth semiconductor layer, which includes the second conductive dopant, on the fourth semiconductor layer, and
    wherein the fourth semiconductor layer has a superlattice structure comprising a plurality of layers.

13. The light emitting device of claim 12, wherein the third and fifth semiconductor layers comprise a P type dopant, and the third and fifth semiconductor layers have a same energy band gap.

14. The light emitting device of claim 12, wherein a P type dopant of the third semiconductor layer has a doping concentration equal to a doping concentration of a P type dopant of the fifth semiconductor layer.

15. The light emitting device of claim 12, wherein the third and fifth semiconductor layers comprise p-GaN, and each of the third and fifth semiconductor layers has a thickness corresponding to 5% to 50% based on a thickness of the second conductive semiconductor layer.

16. The light emitting device of claim 12, further comprising a spacer layer disposed between the active layer and the carrier injection layer, wherein the spacer comprises one of InGaN, AlGaN, and InAlGaN.

17. The light emitting device of claim 16, wherein the spacer layer comprises InGaN in which a content of indium (In) is in a range of 0.01% to 5%, or AlGaN in which a content of aluminum (Al) is in a range of 0.01% to 10%.

18. The light emitting device of claim 12, wherein the electron blocking layer comprises:
    a first electron blocking layer on the carrier injection layer; and a second electron blocking layer disposed on the first electron blocking layer and having an energy band gap greater than an energy band gap of the first electron blocking layer.

* * * * *